US008125357B1

(12) United States Patent
Hamlet et al.

(10) Patent No.: US 8,125,357 B1
(45) Date of Patent: Feb. 28, 2012

(54) DEFLATE DECOMPRESSOR

(75) Inventors: Jason R. Hamlet, Albuquerque, NM (US); Perry J. Robertson, Albuquerque, NM (US); Lyndon G. Pierson, Albuquerque, NM (US); Ronald R. Olsberg, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 26 days.

(21) Appl. No.: 12/729,816

(22) Filed: Mar. 23, 2010

(51) Int. Cl.
*H03M 7/34* (2006.01)
(52) U.S. Cl. .......................................... 341/51; 341/50
(58) Field of Classification Search .................. 341/50, 341/51
See application file for complete search history.

(56) References Cited

U.S. PATENT DOCUMENTS

| | | | | |
|---|---|---|---|---|
| 6,263,413 | B1 * | 7/2001 | Motomura et al. | 711/173 |
| 6,557,083 | B1 * | 4/2003 | Sperber et al. | 711/144 |
| 6,819,271 | B2 * | 11/2004 | Geiger et al. | 341/51 |
| 6,885,319 | B2 * | 4/2005 | Geiger et al. | 341/51 |
| 7,129,860 | B2 * | 10/2006 | Alvarez et al. | 341/51 |
| 2003/0058873 | A1 * | 3/2003 | Geiger et al. | 370/401 |
| 2004/0045030 | A1 * | 3/2004 | Reynolds et al. | 725/110 |

OTHER PUBLICATIONS

"Badge BitSim Accelerated Display Graphics Engine", Product Brief RevK894, 2008, 12 pages, BitSim AB.
"Badger BitSim Accelerated Display Graphic Engine Reference", Preliminary Technical Brief, Dec. 2006, 3 pages, BitSim AB.
Feldspar, Antaeus, "An Explanation of the Deflate Algorithm", originally posted to comp.compression on Aug. 23, 1997, 5 pages.
Deutsch, P., "Deflate Compressed Data Format Specification version 1.3", Aladdin Enterprises, Network Working Group, May 1996, 16 pages.
Mistree, Behram et al., "GZIP Encoding and Decoding in Hardware, 6.375 Final Project Report", 2007, 37 pages.

* cited by examiner

*Primary Examiner* — Jean Jeanglaude
(74) *Attorney, Agent, or Firm* — Madelynne I. Farber

(57) ABSTRACT

A deflate decompressor includes at least one decompressor unit, a memory access controller, a feedback path, and an output buffer unit. The memory access controller is coupled to the decompressor unit via a data path and includes a data buffer to receive the data stream and temporarily buffer a first portion the data stream. The memory access controller transfers fixed length data units of the data stream from the data buffer to the decompressor unit with reference to a memory pointer pointing into the memory buffer. The feedback path couples the decompressor unit to the memory access controller to feed back decrement values to the memory access controller for updating the memory pointer. The decrement values each indicate a number of bits unused by the decompressor unit when decoding the fixed length data units. The output buffer unit buffers a second portion of the data stream after decompression.

21 Claims, 12 Drawing Sheets

DEFLATE DECOMPRESSOR

STATEMENT REGARDING FEDERALLY SPONSORED RESEARCH

This invention was developed with Government support under Contract No. DE-AC04-94AL85000 between Sandia Corporation and the U.S. Department of Energy. The U.S. Government has certain rights in this invention.

TECHNICAL FIELD

This disclosure relates generally to data compression/decompression, and in particular but not exclusively, relates to lossless data compression/decompression using the deflate algorithm.

BACKGROUND INFORMATION

Lossless data compression is a category of data compression algorithms that facilitate exact recreation of original data from compressed data. One such type of lossless data compression algorithm is the Deflate compression algorithm. The Deflate algorithm is described in Request for Comment ("RFC") 1951, entitled, "DEFLATE Compressed Data Format Specification v1.3," published by the Network Working Group in May 1996. The Deflate algorithm compresses data through a two step process: 1) Lempel-Ziv (LZ77) coding followed by 2) Huffman coding.

LZ77 is a dictionary coding scheme that achieves compression by replacing data that appears several times within a dataset by (length, distance) pairs that point into a 32 KB sliding window of past output. When at least three consecutive bytes of data appear that already exist within the 32 KB sliding window, the bytes are replaced by a (length, distance) pair, where the length specifies how many bytes of data are repeated and the distance specifies how many bytes to look backwards in the sliding window for the beginning of the match. It is possible for distance>length, meaning that the match extends beyond the last byte of data stored in the sliding window at the start of the LZ77 decompression.

Following LZ77 coding, Huffman coding is applied. The LZ77 compressed data is encoded as prefix-free variable length Huffman codewords. These codewords are drawn from two distinct sets (also referred to as alphabets)—one for the lengths and literal codewords and another for the distance codewords. The literal codewords are codewords that are not part of a (length, distance) pair. The Huffman encoding achieves compression by replacing the most common words by short codewords and the least common words by long codewords.

The Deflate algorithm permits two types of Huffman encoding: static encoding and dynamic encoding. Static encoding uses two predefined Huffman codes, one for the lengths/literals and another for the distances, while dynamic encoding uses two Huffman codes derived from the dataset itself.

The Deflate algorithm is used to compress a variety of data types and is the compression algorithm used in gzip data compression, PNG image files, and ZIP files. Conventional techniques for "decompressing" or "inflating" a data compressed with Deflate algorithm are software solutions. While inexpensive, these decompression solutions are limited in speed and are therefore less than ideal for high speed environments such as network appliances (e.g., routers, switches, traffic shapers/analyzers, etc.) or real-time hard-disk compression.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method of operation for a deflate decompressor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the present invention include a deflate decompressor that can efficiently decompress or "inflate" data compressed with the deflate algorithm. The deflate decompressor can be implemented entirely in software or firmware, entirely in hardware (e.g., field programmable gate array, application specific integrated circuit, offload engine coupled to a CPU or other controller), or implemented in a combination of software, firmware, and hardware.

Figure 1A:
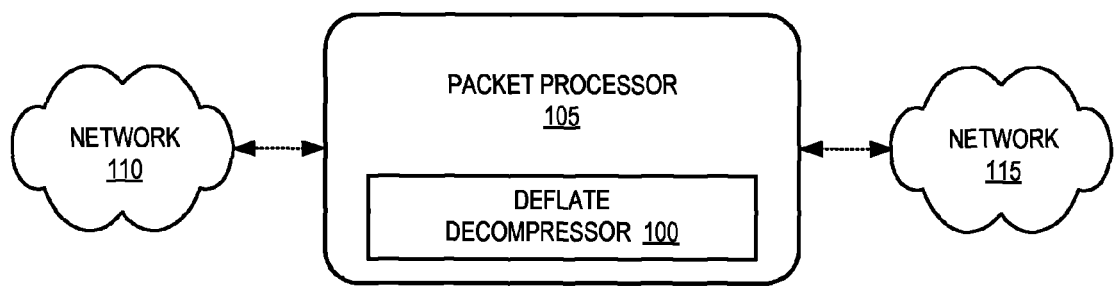
FIG. 1A is a functional block diagram illustrating a packet processor including a deflate decompressor for implementing high speed deep packet analysis on packets carrying compressed data blocks, in accordance with an embodiment of the invention.

FIG. 1A is a functional block diagram illustrating packet processor 105 including a deflate decompressor 100 for implementing high speed deep packet analysis on packets carrying compressed data blocks, in accordance with an embodiment of the invention. Packet processor 105 may represent a network appliance box (e.g., router, switch, traffic shaper, traffic analyzer, packet sniffer, etc.) coupled within a single network (not illustrated) or linked between networks 110 and 115. Networks 110 and 115 may represent any of a local area network ("LAN"), a metro area network ("MAN"), a wide area network ("WAN"), a wireless network (e.g., WiFi networks, WiMax networks, etc.), the Internet, or otherwise. As packets flow through packet processor 105, they may be selectively routed through deflate decompressor 100 for a variety of reasons. For example, deflate decompressor 100 may enable line rate or near line rate decompression of packet payloads carrying data compressed or "deflated" using the Deflate algorithm. Line rate or near line rate decompression can facilitate real-time deep packet analysis ("DPA") of packet payloads. This real-time DPA can enable packet sniffing, packet filtering (e.g., virus filtering), quality of experience ("QoE"), quality of service ("QoS"), differentiated services, or otherwise on compressed data flows. In one embodiment, deflate decompressor 100 is implemented as a hardware offload or acceleration engine within packet processor 105.

Figure 1B:
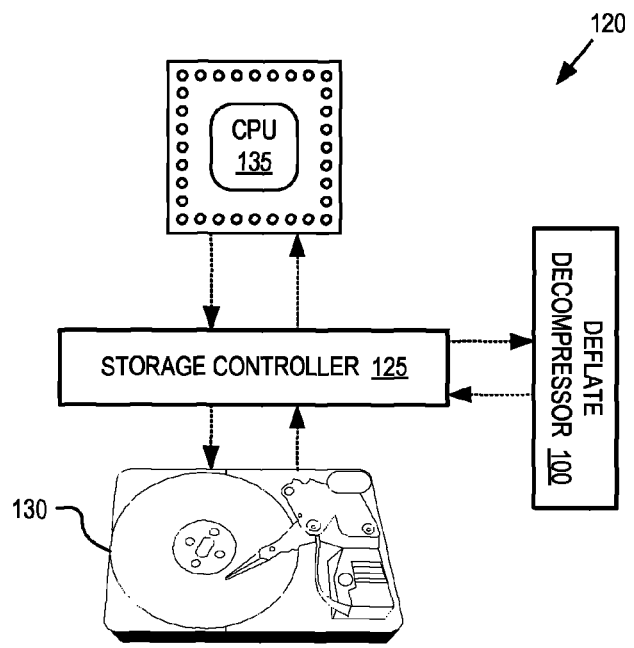
FIG. 1B is a functional block diagram illustrating a computing system including a deflate decompressor coupled with a storage controller for implementing real-time access of compressed data on a storage device, in accordance with an embodiment of the invention.

FIG. 1B is a functional block diagram illustrating computing system 120 including deflate decompressor 100 coupled with a storage controller 125 for implementing real-time access of compressed data on a storage device 130, in accordance with an embodiment of the invention. Deflate decompressor 100 may be incorporated externally (illustrated) or internally (not illustrated) into storage controller 125 to provide CPU 135 with real-time access to compressed data on storage device 130. One or more volumes or folders within storage device 130 may store data compressed using the Deflate algorithm. As compressed data is read from storage device 130, storage controller 125 may divert the compressed data through deflate decompressor 100 for inflation, which in turn is provided to CPU 135 or other requesting system components. In other words, embodiments of deflate decompressor 100 may be used to implement real-time access to compressed data storage on a storage device, such as a hard disk drive, a non-volatile memory device (e.g., flash), volatile memory devices (e.g., RAM), or otherwise. In some embodiments, deflate decompressor 100 may even be incorporated into a network interface card or other communication links of computing system 120 to facilitate real-time compressed data communication over bandwidth constrained communication links.

Figure 2:
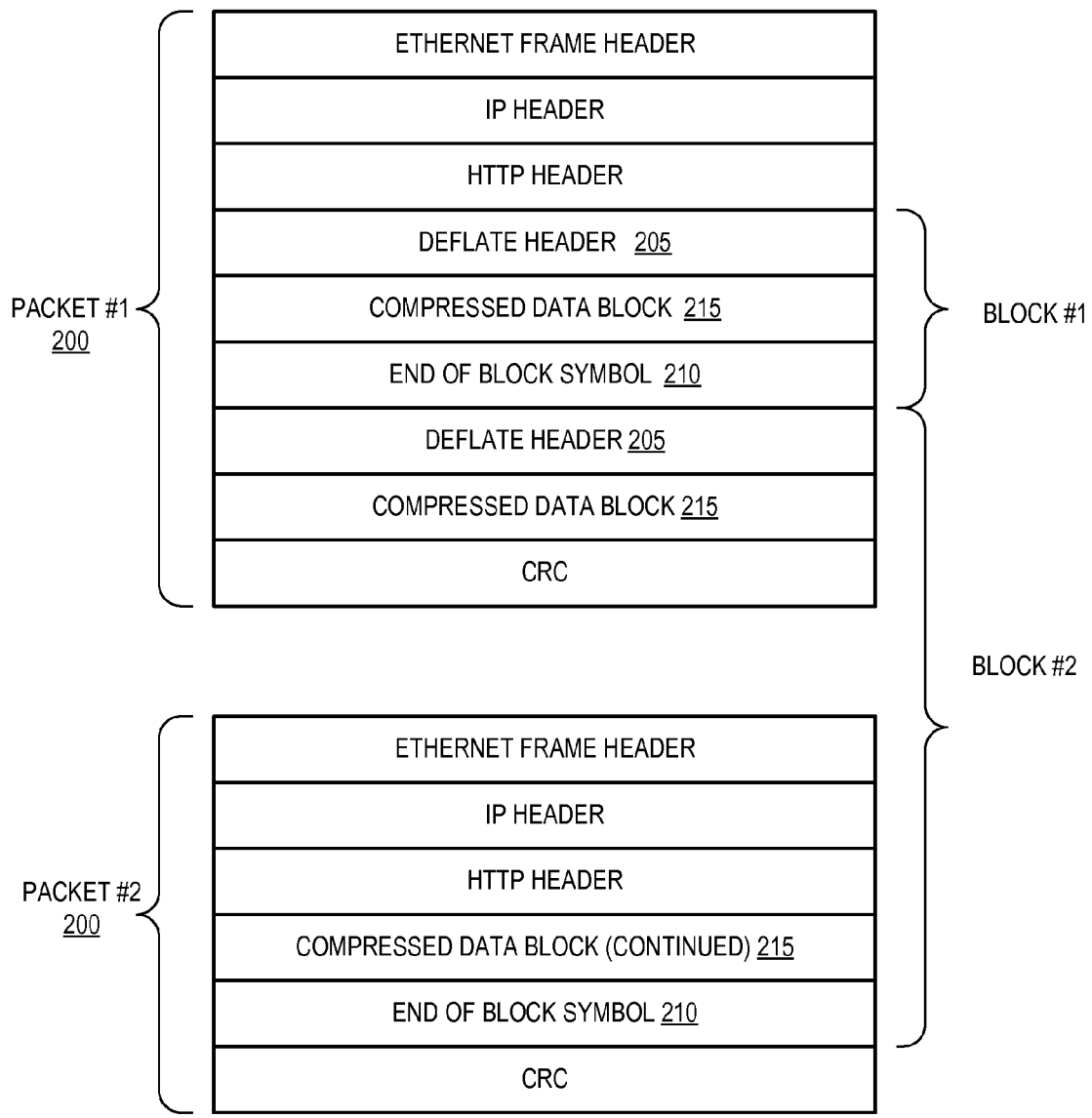
FIG. 2 is a block diagram illustrating components of packets carrying compressed data blocks, in accordance with an embodiment of the invention.

FIG. 2 is a block diagram illustrating example Ethernet packets 200 carrying a compressed dataset, in accordance with an embodiment of the invention. Ethernet packets 200 represent consecutive packets within a flow of compressed packets travelling over an Ethernet medium. A compressed dataset can be made up of several individual blocks (illustrated in FIG. 2 as blocks #1 and #2), each beginning with a deflate header 205, ending with an end of block symbol 210, and surrounding the actual compressed data block 215 itself. Compressed data blocks 215 are of variable size, each can have a different compression type, and in the case of dynamic Huffman encoding, each block can have different Huffman tables. However, within a given compressed data block 215, the same compression scheme and Huffman tables are applied. As illustrated, the blocks may be carried within Ethernet packets (or other packet, cell, or frame types), but are not limited by the maximum transmission unit ("MTU") of the carrier unit. Rather, multiple blocks may be carried within a single packet (e.g., packet #1 includes block #1 and part of block #2), or a single block may span multiple packets (e.g., block #2 spans packets #1 and #2). Since decompression proceeds sequentially, blocks are decompressed in order.

Figure 3:
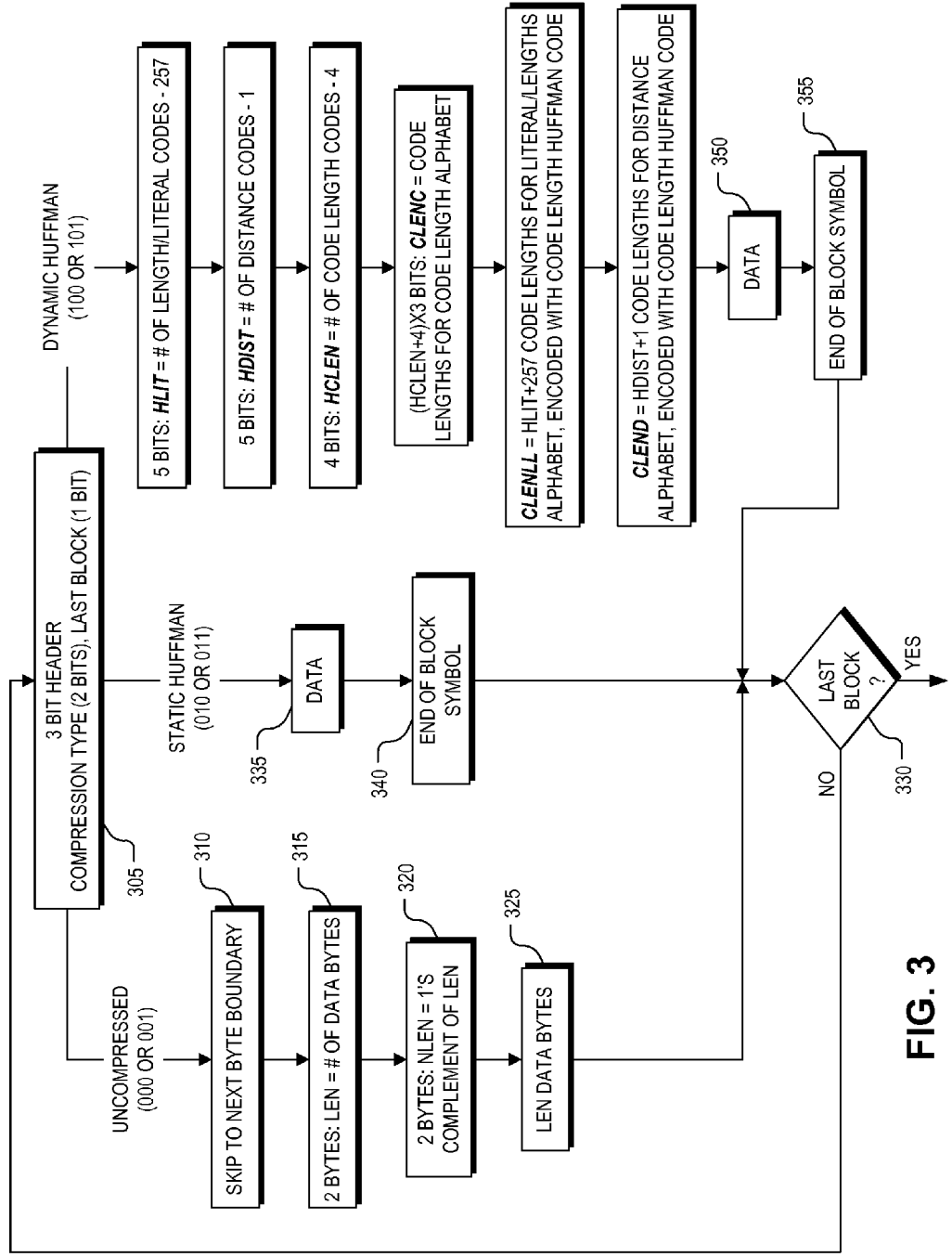
FIG. 3 is a flow chart illustrating header interpretation of packets carrying compressed data blocks, in accordance with an embodiment of the invention.

FIG. 3 is a flow chart illustrating header interpretation and block processing of packets 200 carrying compressed data blocks 215, in accordance with an embodiment of the invention. In the illustrated embodiment, each deflate header 205 is a 3-bit header, where the first 2-bits encode the compression type and the last 1-bit encodes whether the current block is the last block in the compressed dataset (process block 305).

The first 2-bits encoded as "00" signifies that an uncompressed data block 215 follows. In this scenario, block processing skips to the next byte boundary (process block 310). The following two bytes encode the length (LEN) of the uncompressed data block 215 (process block 315), followed by the 1's complement of the length (NLEN) (process block 320), followed by LEN number of data bytes (process block 325). If the 3-bit header indicates that this is the last block, then decompression is complete, otherwise these LEN bytes are followed by another 3-bit header (decision block 330).

The first 2-bits encoded as "01" signifies that the following compressed data block 215 is compressed using static Huffman tables. In this scenario, the static Huffman tables are known in advance. Immediately following the deflate header 205, is the compressed data itself (process block 335), followed by the end of block symbol 215 at processing block 340.

The first 2-bits encoded as "10" signifies that the following compressed data block 215 is compressed using dynamic Huffman tables. In this scenario, information for recreating the dynamic Huffman tables is compressed and then embedded into the compressed data block 215 itself. Accordingly, before decompression of the actual data can commence, the information for creating the dynamic Huffman tables is decompressed and used to establish the dynamic Huffman tables used to decompress the remainder of the compressed data block 215 that contains the actual data. In order to recreate the dynamic Huffman tables used to decode the data, a couple of well-known rules are followed. The length of each code used to encode a character or element of the uncompressed dataset is included in the compressed dataset. This length value is referred to as a "codelength." Since dynamic Huffman coding compresses the information for creating the dynamic Huffman tables, which in turn contains the information for decompressing the dataset itself, a number of Huffman code information fields are embedded at the beginning of compressed data block 215. These fields are discussed below. The Huffman code information is immediately followed by the actual data (process block 350), which is followed by the end of block symbol 215 at processing block 355.

In the case of dynamic Huffman coding, the following information is included within the compressed data block 215 immediately following the 3-bit deflate header 205: HLIT indicating the number of length/literal codes less 257; HDIST indicating the number of distance codes less one; HCLEN indicating the number of codelength codes less four (for creating the codelength Huffman table); CLENC indicating the code lengths for each codelength alphabet (of the codelength Huffman table); CLENLL indicating the code lengths for the length/literal alphabet of the Length/Literal Huffman table; CLEND indicating the code lengths for the distance alphabet of the Distance Huffman table. Again it is restated, because the dynamic Huffman encoding compresses the information for creating the dynamic Huffman tables, which in turn are used to decode the actual data, the HCLEN and CLENC: fields contain information for creating the codelength Huffman table, while the CLENLL and CLEND fields contain information for creating the length/literals Huffman table and the Distance Huffman table.

Figure 4:
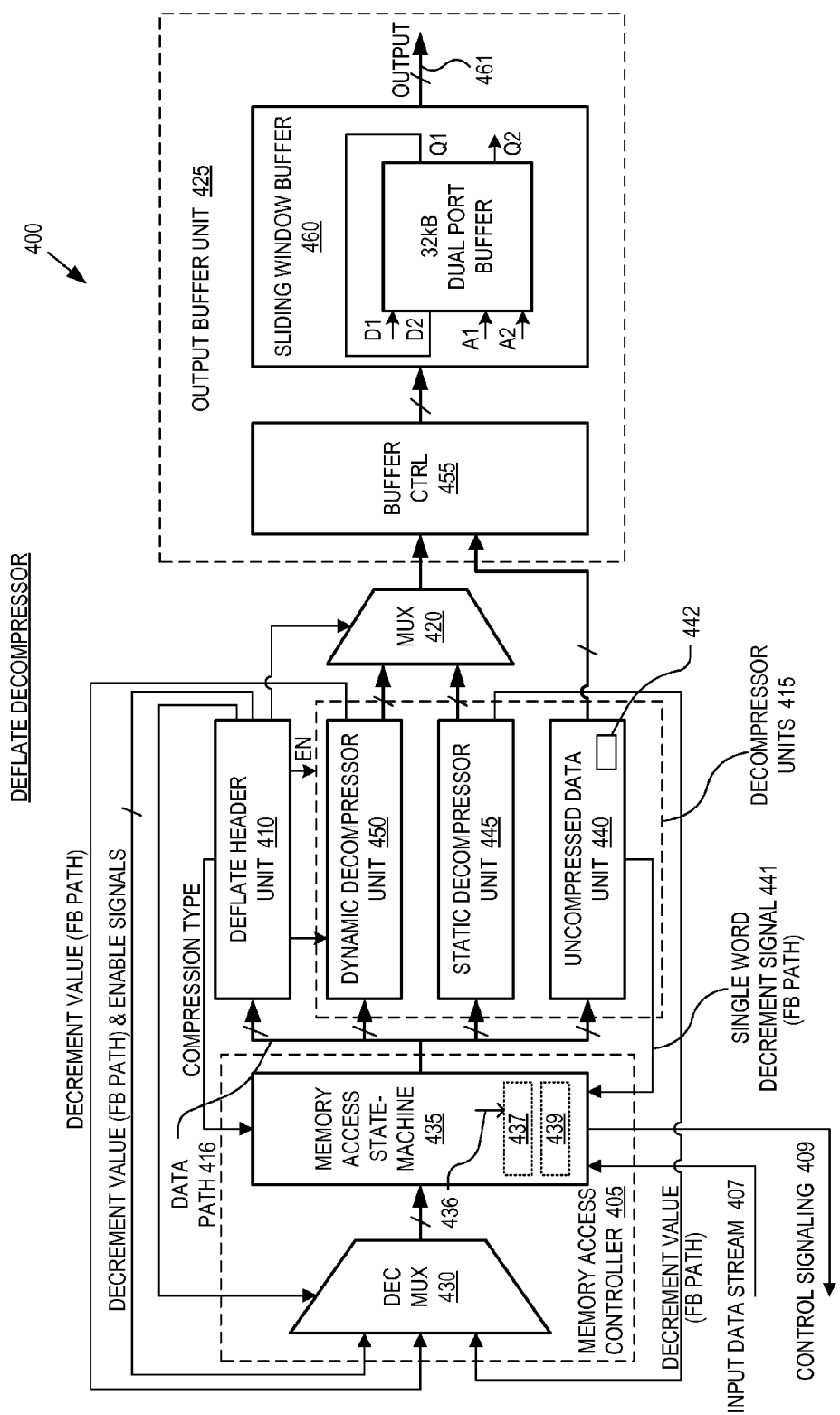
FIG. 4 is a functional block diagram illustrating a deflate decompressor, in accordance with an embodiment of the invention.

FIG. 4 is a functional block diagram illustrating a deflate decompressor 400, in accordance with an embodiment of the invention. Deflate decompressor 400 represents one possible implementation of deflate decompressors 100 illustrated in FIGS. 1A and 1B. The illustrated embodiment of deflate decompressor 400 includes a memory access controller 405, a deflate header unit 410, decompressor units 415, a multiplexer ("MUX") 420, and an output buffer unit 425. The illustrated embodiment of memory access controller 405 includes a decrement MUX ("DEC MUX") 430 and a memory access state-machine 435. The illustrated embodiment of decompressor units 415 includes an uncompressed data unit 440, a static decompressor unit 445, and a dynamic decompressor unit 450. The illustrated embodiment of output buffer unit 425 includes a buffer controller 455 and a sliding window buffer 460. In one embodiment, sliding window buffer 460 is a dual port buffer having one output Q1 fed back to one of its inputs D2.

Memory access controller 405 accepts an input data stream of compressed data and delivers the compressed data to deflate header unit 410 or the appropriate one of decompressor units 415 in fixed length data units. Huffman encoding uses code words of variable length to represent data. It is not known a priori how many input bits are required to uncompress the next literal value or length-distance pair. As such, it is not known in advance how many bits of compressed data should be delivered by memory access controller 405 to deflate header unit 410 or decompressor units 415 for a given decompression cycle. Therefore, in one embodiment, memory access controller 405 always delivers the maximum number of bits possibly needed by deflate header unit 410 or any of decompressor units 415 to perform a given decompression operation. If the number of bits delivered by memory access controller 405 turns out to be more than necessary, then an unused number of bits signal, referred to as a "decrement value," is fed back by the receiving unit so that memory access controller 405 can adjust its memory pointer accordingly, and redeliver those unused bits for the next decompression operation. The decrement values are delivered to DEC MUX 430 along a variety of feedback (FB) paths and the correct FB path selected using a SEL input generated by deflate header unit 410. Accordingly, deflate decompressor 400 can inflate a stream of compressed data that has been coded with variable sized Huffman codes without advance knowledge of the delineations between each code.

In the illustrated embodiment, memory access controller 405 includes memory access state-machine 435, which accepts the input data stream of compressed data and provides the data along with enable signals to deflate header unit 410 and decompressor units 415. The fixed length data units are delivered on a data path 416. Memory access controller 405 includes two data buffers 437 and 439 for receiving and managing the compressed data. In one embodiment, data buffer 437 is implemented as a 64-bit register and data buffer 439 is implemented as a 128-bit register. Initially, data buffers 437 and 439 are filled with compressed data from input data stream 407. Data transferred out of memory access state-machine 435 is retrieved from data buffer 437 (and occasionally data buffer 439 if data buffer 437 is emptied) at the location pointed to by memory pointer 436. Once data buffer 437 is emptied, a portion of the contents of data buffer 439 are transferred into data buffer 437. Control signaling 409 is used by memory access state-machine 435 to request additional compressed data as buffer space becomes available.

As previously mentioned, since it is not known a priori how many bits are required for a particular decompression cycle, memory access state-machine uses the decrement values fed back from deflate header unit 410 and decompressor units 415 on FB paths to adjust the location of memory pointer 436 and determine the next data batch to output. In one embodiment, the size of a single fixed length data unit transferred out by memory access state-machine 435 is 57 bits. However, the number of bits required for a decompression cycle varies dependent upon: 1) whether deflate header information is being processed by deflate header unit 410, 2) whether uncompressed data is being processed by uncompressed data unit 440, 3) whether compressed data is being decoded by static decompressor unit 445, 4) whether compressed data is being decoded by dynamic decompressor unit 450, 5) whether the dynamic decompressor unit 450 is building the codelengths Huffman table, or 6) whether the compressed data being inflated is a length-distance pair or a literal value. In an alternative embodiment, the transferred data units are "fixed" length for a given type of decompression operation, but does not vary based upon the variable length codes within a given decompression operation type.

Deflate header unit 410 accepts deflate header 205 from memory access state-machine 435 and uses it to determine how the data is compressed, according to TABLE 1.

TABLE 1

| | |
|---|---|
| "000" | Not last block; no compression |
| "001" | Last block; no compression |
| "010" | Not last block; block uses static Huffman tables |
| "011" | Last block; block uses static Huffman tables |
| "100" | Not last block; block uses dynamic Huffman tables |
| "101" | Last block; block uses dynamic Huffman tables |
| "110" | Not last block; illegal compression (reserved for future use) |
| "111" | Last block; illegal compression (reserved for future use) |

Based on decoding the 3-bit deflate header 205, deflate header unit 410 will enable the appropriate decompressor unit. If dynamic Huffman encoding is determined, then deflate header unit 410 will also parse the HDIST, HLIT, and HCLEN values from the input data stream and provide them to dynamic decompressor unit 450. Upon any of the decompressor units 415 observing the end of block ("EOB") symbol 210, deflate header unit 410 is notified, who then disables all enable outputs.

DEC MUX 430 accepts the decrement values from deflate header unit 410, static decompressor unit 445, and dynamic decompressor unit 450 along with the enable signals output from deflate header unit 410. The enable signals are used as selector inputs to determine which decrement value to pass onto memory access state-machine 435.

MUX 420 selectively couples the Huffman decoded outputs from dynamic decompressor unit 450 and static decompressor unit 445 to output buffer unit 425 under control of the enable signals output from deflate header unit 410. Uncompressed data output from either dynamic decompressor unit 450 or static decompressor unit 445 must still be LZ77 expanded by output buffer unit 425. In contrast, uncompressed data flowing through uncompressed data unit 440 does not and therefore follows a different data flow path through buffer controller 455 into sliding window buffer 460. Accordingly, in the illustrated embodiment, uncompressed data unit 440 bypassed MUX 420 and couples directly to output buffer unit 425. However, alternative configurations including coupling uncompressed data unit 440 to output buffer unit 425 via MUX 420 may also be implemented.

Buffer controller 455 controls reading from and writing to sliding window buffer 460. In one embodiment, sliding window buffer 460 maintains a minimum 32 kB buffer of past decompressed data as mandated by RFC1951. Buffer controller 455 reads the Huffman decoded length, literal, distance values and produces the correct addresses A1 and A2, data values D1 and D2, and read/write control signals for reading from and writing into sliding window buffer 460. In other words, buffer controller 455 interprets the LZ77 length-distance pairs to retrieve and replicate past literal values currently stored within sliding window buffer 460. When uncompressed data is delivered to buffer controller 455 from uncompressed data unit 440, no length-distances pairs are present in the data stream and therefore all values are literal values. In this case, both data input ports D1 and D2 may be used to simultaneously write two data words into sliding window buffer 460 at a time. If the data stream contains an odd number of data words, then only 1 word is written into sliding window buffer 460 on the last cycle, and uncompressed data unit 440 asserts single word decrement signal 441 to memory access state-machine 435 so that memory pointer 436 can be backed up accordingly.

In one embodiment, sliding window buffer 460 is a wraparound 32 kB dual port (port D1 and port D2) random access memory ("RAM") component. For compression using static or dynamic Huffman tables, port D2 is used for writes to the RAM, while port D1 is used for reads. For uncompressed data, both ports are used for writes.

When writing a literal, the data goes directly to port D2. When copying a word from one location to another within sliding window buffer 460, as required for length-distance pairs, then there is a short pipeline as follows:

Clk1: read first data word (port D1)
Clk2: write first data word (port D2) and read second data word (port D1)
Clk3: write second data word (port D2) and read third data word (port D1).
Etc.

Uncompressed data unit 440 controls memory writes for uncompressed data (e.g., when 3-bit header is "000" or "001"). In one embodiment, uncompressed data unit 440 is a state-machine with three states: a waitState, a skipLenState, and writeSlate. Uncompressed data unit 440 idles in waitSlate until it is enabled by deflate header unit 410. At this point it stores the value LEN received on data path 416 from memory access state-machine 435 and then transitions to skipLenState, where it spends a single clock period. This allows memory access state-machine 435 time to skip forward in the compressed data stream to the first byte of literal data. In writeSlate uncompressed data unit 440 provides literal data and write enable signals to buffer controller 455. On each write cycle, uncompressed data unit 440 subtracts the number of output words, either one or two, from LEN using a counter 442. Uncompressed data unit 440 returns to waitSlate when LEN=0. Single word decrement signal 441 is asserted by logic coupled to counter 442 when LEN=1, since under this condition there were an odd number of values to be written to sliding window buffer 460, and so an extra byte was provided to uncompressed data unit 440 on its input from memory access state-machine 435. Signal 441 alerts memory access state-machine 435 that it needs to subtract a word number of bits from the location of memory pointer 436 so that it can provide the correct bits to deflate header unit 410 to begin the next decompression cycle.

The deflate algorithm first compresses data with LZ77 coding and then with Huffman coding, so deflate decompressor 400 performs Huffman decoding first followed by LZ77 decoding second. As such, the basic operation of deflate decompressor 400 is to decode a Huffman codeword and determine if the decoded word is a literal, in which case it is written directly to sliding window buffer 460, or the length portion of a length-distance pair, at which point LZ77 decompression is performed. In the case of data compressed using static Huffman tables, since the tables are known a priori, they can be implemented with look up tables ("LUTs")—a length-literal LUT and one or more distance LUTs. The length/literal codewords are variable length, from 7-9 bits, and use up to five extra bits. As such, the length/literal LUT may be designed to accept input as wide as the largest codeword and outputs the decoded word and the number of input bits+extra bits that were not used. Since the length/literal codewords are variable length, the LUTs should be wide enough to hold the longest codeword. Shorter codewords may be repeated within the table. For example, if we had a maximum codeword length of five bits and a three bit codeword "111" then the decoded word corresponding to codeword "111" could be stored in the LUT at memory locations "11100," "11101," "11110," and "11111." On the other hand, the static distance codewords are fixed length of five bits.

Figure 5:
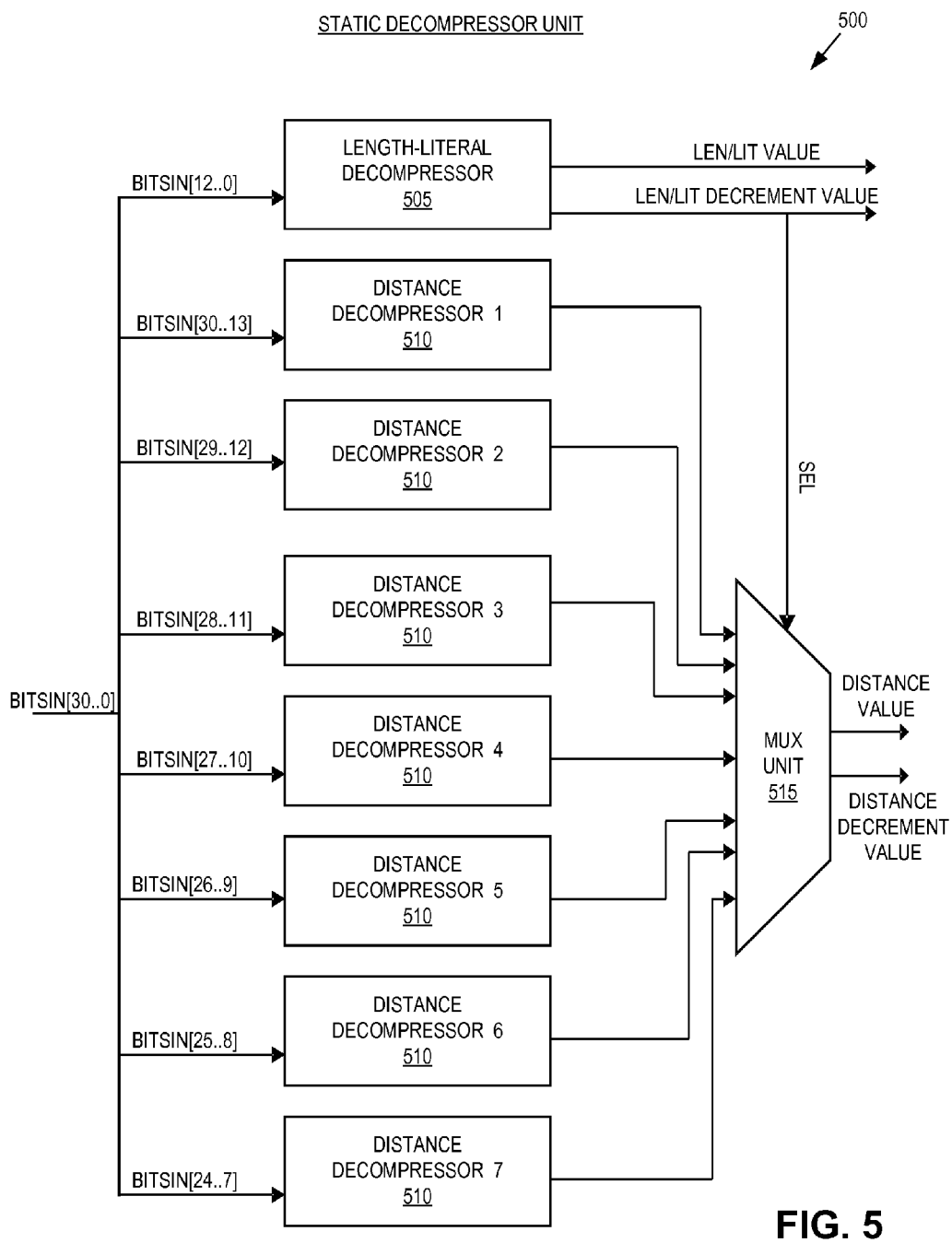
FIG. 5 is a functional block diagram illustrating a static decompressor unit, in accordance with an embodiment of the invention.
Figure 6:
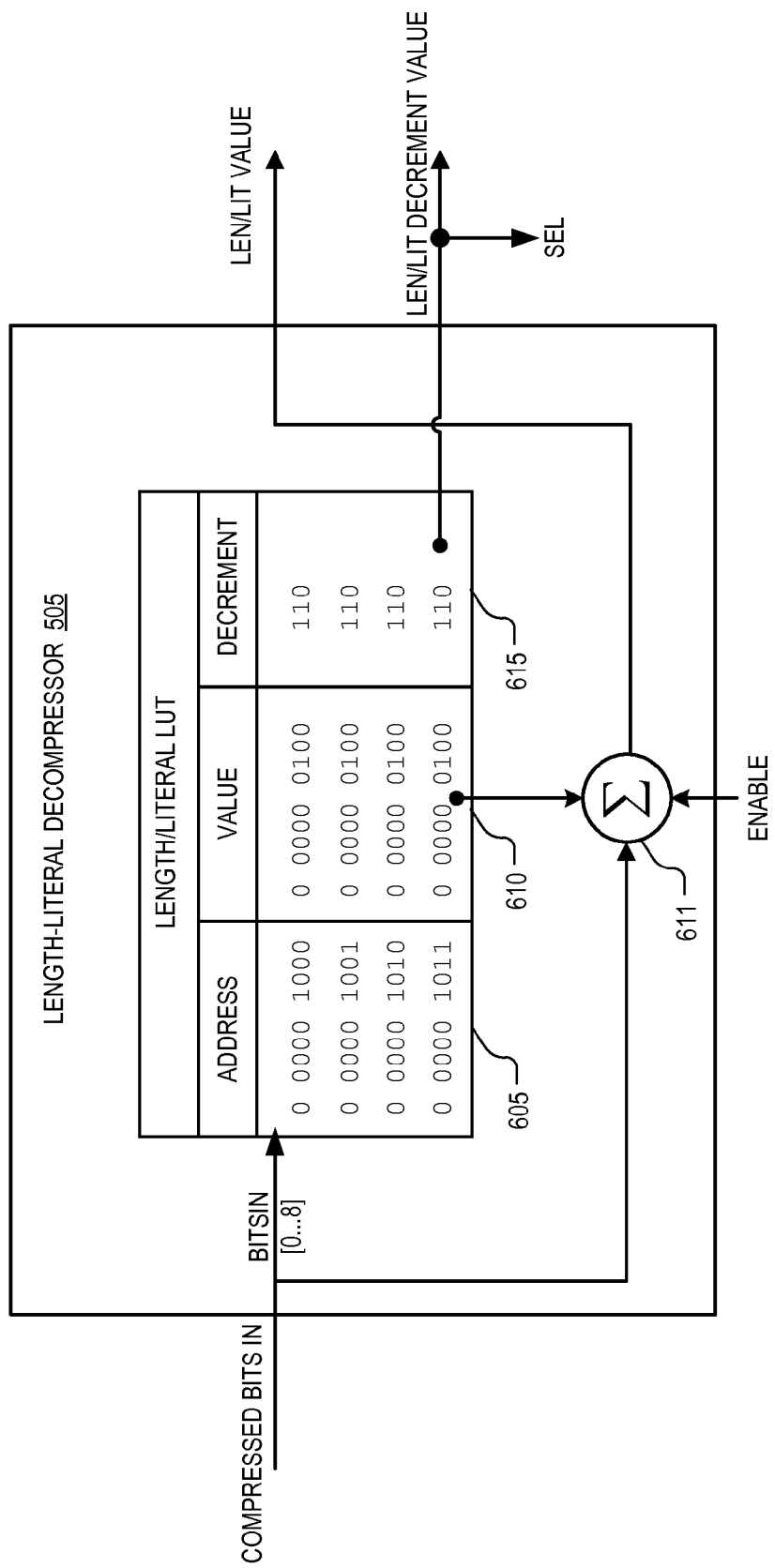
FIG. 6 illustrates a length-literal decompressor, in accordance with an embodiment of the invention.
Figure 7:
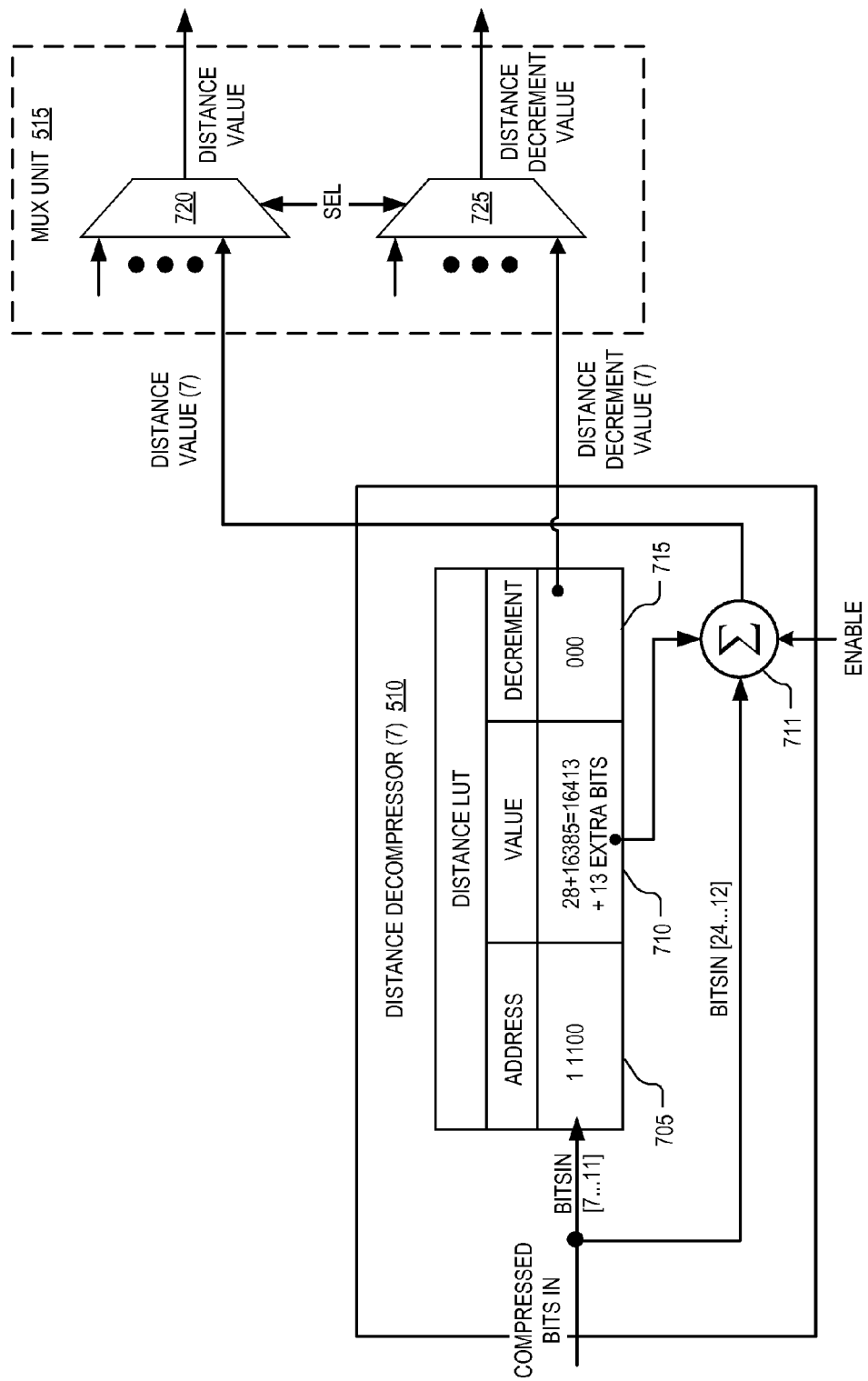
FIG. 7 is a functional block diagram illustrating a distance decompressor and mux unit, in accordance with an embodiment of the invention.

FIG. 5 is a functional block diagram illustrating a static decompressor unit 500, in accordance with an embodiment of the invention. Static decompressor unit 500 is one possible implementation of static decompressor unit 445. The illustrated embodiment of static decompressor unit 500 includes a length-literal decompressor 505, distance decompressors 510, and a mux unit 515. FIG. 6 illustrates greater detail of length-literal decompressor 505 while FIG. 7 illustrates greater detail of distance decompressor (7) 510 and mux unit 515.

In the illustrated embodiment, length-distance pairs are decoded in a single clock cycle by running in parallel a single length-literal LUT with seven distance LUTs. A first portion (e.g., bits 8-0) of the compressed BITSIN from memory access state-machine 435 are used to index into an address column 605 of the length-literal LUT within length-literal decompressor 505. The corresponding LEN/LIT value is output from a value column 610 and added to additional bits if necessary. Length-literals can have extra bits, per RFC 1951, that at times are added to the bits of value column 610 as illustrated with the selectively enabled adder 611. When extra bits are not added, the enable signal of adder 611 is disabled and the value from value column 610 is passed directly to the output of length-literal decompressor 505. The corresponding LEN/LIT decrement value is output from a decrement column 615. The LEN/LIT value is provided to output buffer unit 425 via mux 420, while the LEN/LIT decrement value is fed back to memory access controller 405 to indicate the unused number of bits for adjusting memory pointer 436 and the LEN/LIT decrement value is also provided to mux unit 515 to act as a selector input.

A second portion (e.g., bits 30-13) of the compressed BITSIN from memory access state-machine 435 are used by distance decompressors 510 to index into an address column 705 of a distance LUT. The corresponding distance value from a value column 710 is output (after being added to additional bits if necessary by enabling adder 711) and the corresponding distance decrement value is output from a decrement column 715. The seven distances values are provided to a distance value MUX 720 while the seven distance decrement values are provided to a distance decrement MUX 725. The LEN/LIT decrement value output from length-literal decompressor 505 is then used to select which output from which distance decompressor 510 will be used. The select distance value is delivered to output buffer unit 425 and the select distance decrement value is fed back to memory access controller 405 to adjust memory pointer 436.

Seven distance decompressors 510 (or seven distance LUTs) are used to account for each of the possible lengths of the length/literal codewords. If the output of the length/literal LUT is part of a length-distance pair, then the unused bits portion of the length/literal LUT is used to select which of the distance LUTs holds the correct output. If the output of the length/literal LUT is a literal, then none of the distance LUTs is selected. In either case, the total number of unused input bits is communicated back to memory access controller 405 to adjust the position of memory pointer 436 so that the correct input bits are provided for the next decompression cycle.

Once the static Huffman decoding has been performed by static decompressor unit 445, LZ77 decompression is accomplished by controlling the read and write addresses to sliding window buffer 460, which may be implemented as a dual-port memory. One port may be used for reading while the other is used for writing. In this way, an output word can be written while the next output word can be read during the same clock cycle. This permits one word of output data to be written on each clock cycle during decompression of static Huffman deflate compressed data.

Figure 8:
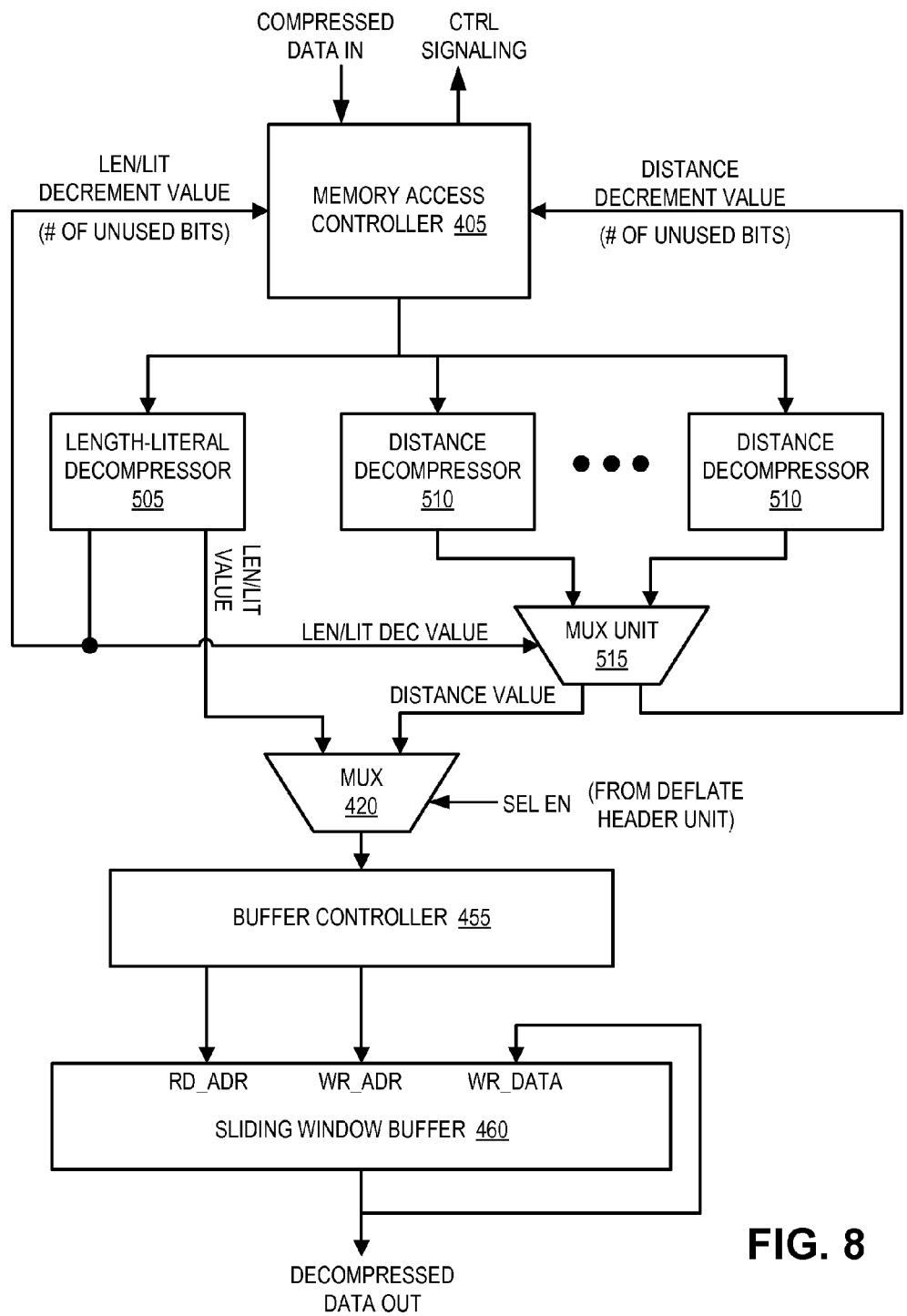
FIG. 8 is a functional block diagram illustrating data flow through the deflate decompressor during inflation of data compressed using static Huffman tables, in accordance with an embodiment of the invention.

FIG. 8 is a functional block diagram illustrating data flow through the deflate decompressor 400 during inflation of data compressed using static Huffman tables, in accordance with an embodiment of the invention. As illustrated, memory access state-machine 435 provides BITSIN of the compressed input data stream 407 to length-literal decompressor 505 and all seven distance decompressors 510. The seven distance decompressors 510 decode the distance value based on seven different assumed starting bits within the bit stream. The LEN/LIT decrement value output from the length-literal decompressor 505 is used to select the correct distance value at mux unit 515. The enable outputs from deflate header unit 410 are applied to MUX 420 to select outputs from static decompressor unit 445 to deliver to buffer controller 455, which in turn writes the literal values into sliding window buffer 460 and uses the length-distance pair values to copy & paste data from the sliding window buffer 460 to perform LZ77 decompression.

Figure 9:
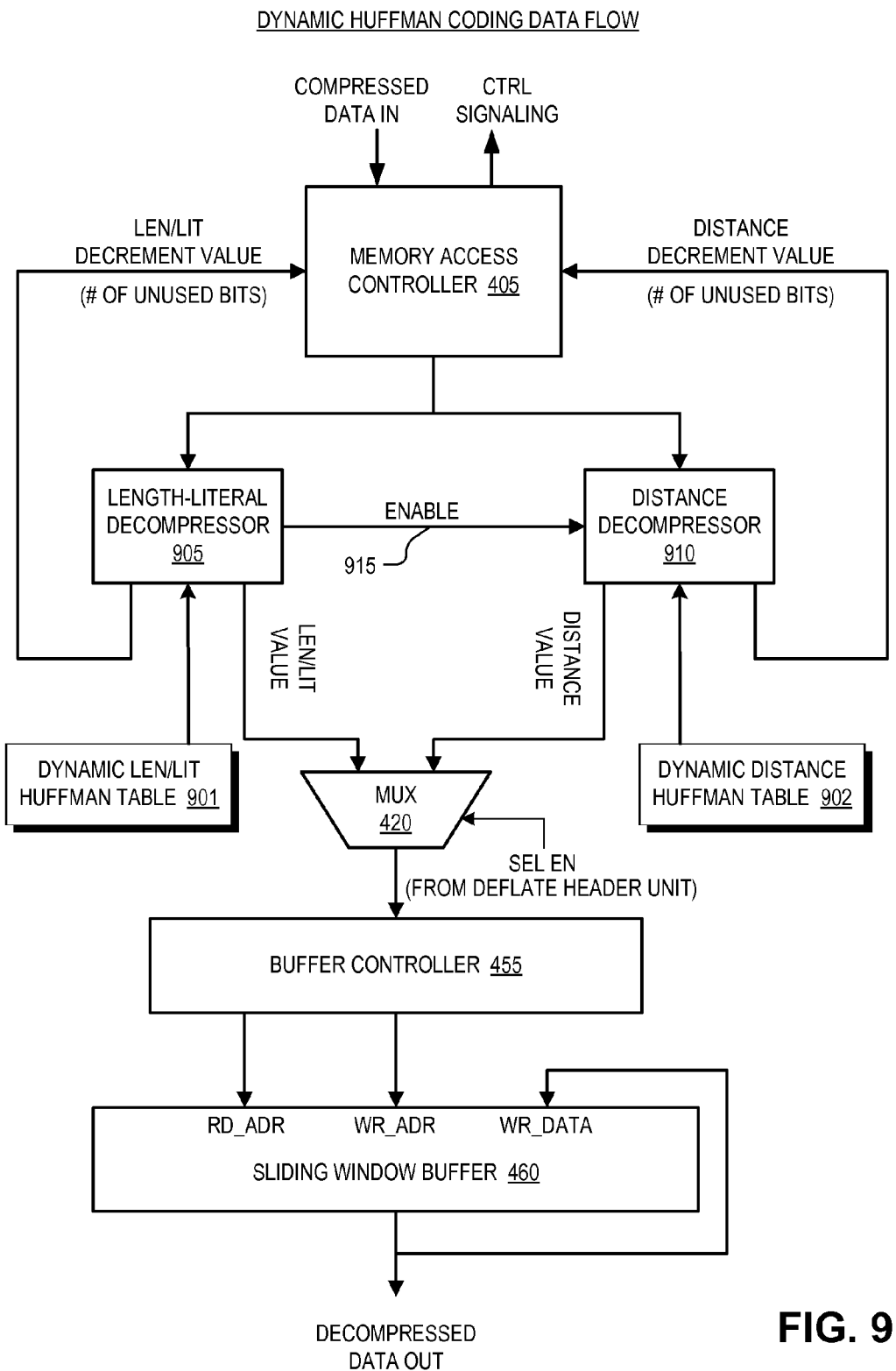
FIG. 9 is a functional block diagram illustrating data flow through the deflate decompressor during inflation of data compressed using dynamic Huffman tables, in accordance with an embodiment of the invention.

FIG. 9 is a functional block diagram illustrating data flow through deflate decompressor 400 during inflation of data compressed using dynamic Huffman tables, in accordance with an embodiment of the invention. Decompression of data encoded with dynamic Huffman codes proceeds similarly to the static case described above; however, the dynamic case includes additional decoding steps for building the dynamic length/literal Huffman table 901 and the dynamic distance Huffman table 902, as these tables are no longer known prior to decompression. Instead, information to recreate the tables is included within the compressed data stream itself. FIG. 9 illustrates the data flow after creation of the dynamic Huffman tables.

Referring to the static decompression data flow (illustrated in FIG. 8), it can be seen that the static decompression accomplishes length/literal decompression in parallel with distance decompression by using seven instances of distance decompressor 510. The output of the length-literal decompressor 505 is then used to select the correct output from distance decompressors 510. In contrast, the illustrated embodiment of the dynamic decompression data flow (FIG. 9), performs length/literal decompression and distance decompression serially. Length-literal decompressor 905 decodes the length/literal value first. If the value is a literal, the next codeword will be a length or literal value. However, if the value is a length value, then the next codeword is a distance value, in which case, length-literal decompressor 905 notifies distance decompressor 910 via enable signal 915, and the next codeword is decoded by distance decompressor 910.

The dynamic decompression data flow illustrated in FIG. 9 serializes decompression of the length/literal values prior to the decompression of the distance values to economize memory usage. The dynamic Huffman tables (both length/literal LUT and distance LUT) store codes of length up to 15-bits, (as opposed to 5-bit distance codes and 7-9 bit length-literal codes in the static case), requiring signification memory resources for each of the LUTs ($2^{15}$=32,768 table entries). The memory resources required for a full parallel implementation, as in the static case, may not be available in many platforms. However, where sufficient memory resources are available, then the dynamic decompression data flow may be implemented using parallel distance decompressors, as in the static case.

Figure 10:
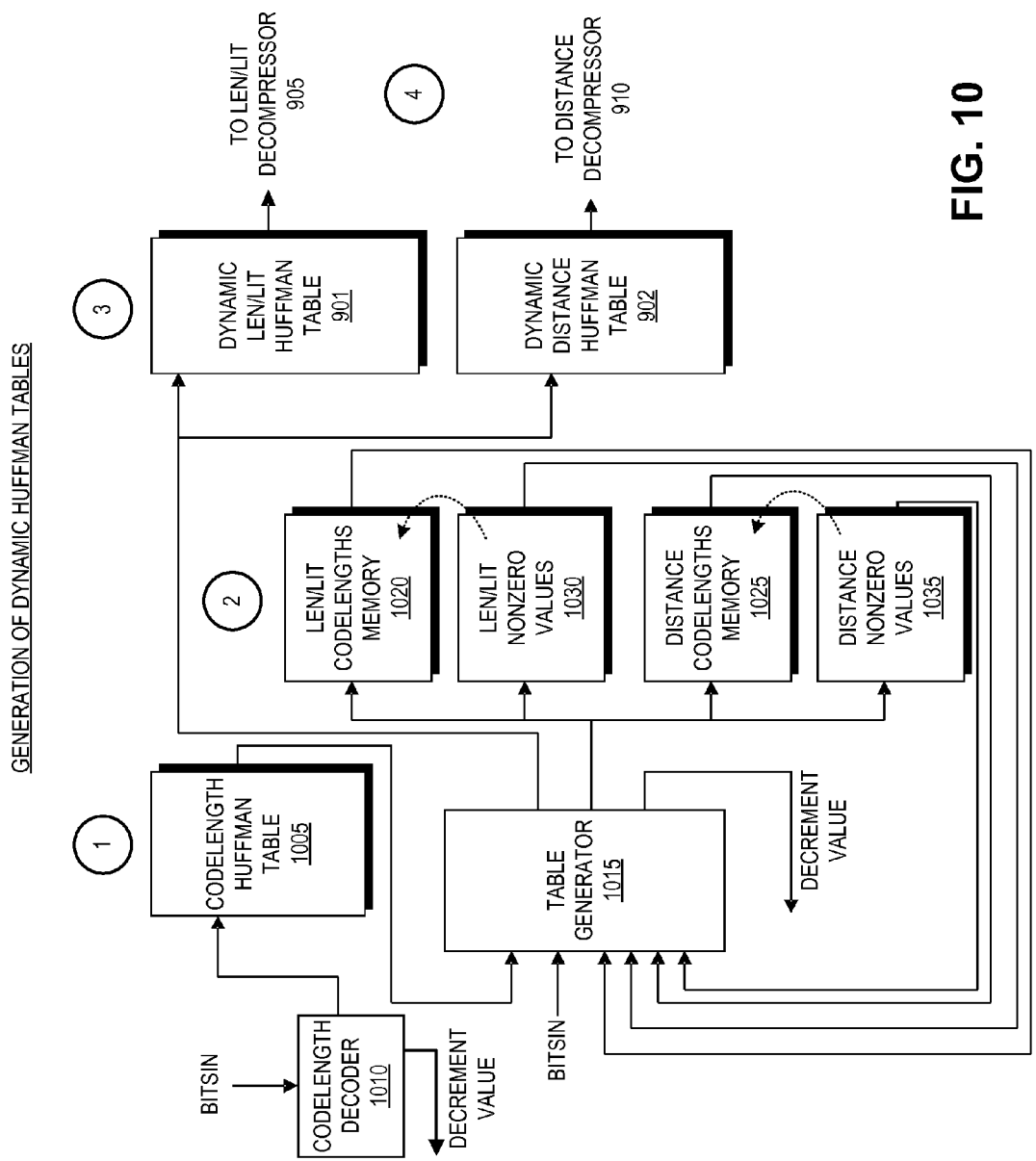
FIG. 10 is a functional block diagram illustrating creation of dynamic Huffman tables during inflation of compressed data, in accordance with an embodiment of the invention.

FIG. 10 is a functional block diagram illustrating creation of dynamic Huffman tables during inflation of compressed data, in accordance with an embodiment of the invention. Because the information for generating dynamic LEN/LIT Huffman table 901 and dynamic distance Huffman table 902 is itself compressed using dynamic Huffman coding, before either table 901 or 902 can be created, a codelength Huffman table 1005 is generated (and stored into a codelength memory unit) to decode this information. A codelength decoder 1010 generates codelength Huffman table 1005 based on the input bit stream (BITSIN), while a table generator 1015 uses codelength Huffman table 1005 to generate dynamic LEN/LIT Huffman table 901 and dynamic distance Huffman table 902.

The dynamic Huffman tables constructed by the deflate algorithm are defined in such a way that they can be uniquely specified by the lengths of their codewords. As such, the dynamic Huffman tables themselves are not included in the data stream, but instead the lengths of the codewords are transmitted. The codeword lengths are constrained to a maximum of 15 bits. Two sequences of code lengths appear in the data: one for the length/literal codes and the other for the distance codes. These sequences are themselves compressed using a type of run-length encoding, wherein the values 0-15 represent code lengths of 0-15; while 16, 17, and 18, possibly followed by additional bits, are used to indicate either that the previous code length should be repeated a number of times, or that a code length of zero should be repeated a number of times. According to RFC 1951:

| | |
|---|---|
| 0-15: | Represent code lengths of 0-15 |
| 16: | Copy the previous code length 3-6 times. The next 2 bits indicate repeat length (0 = 3, . . . , 3 = 6) |
| 17: | Repeat a code length of 0 for 3-10 times. (3 bits of length) |
| 18: | Repeat a code length of 0 for 11-138 times (7 bits of length). |

Thus, the code lengths appear as a sequence drawn from the alphabet {0, 1, ..., 18}. The alphabet {0, 1, ..., 18} is further compressed also using dynamic Huffman coding. As before, this Huffman coding can be uniquely specified by the lengths of its codewords. The code lengths for this codelength alphabet are each 3 bits, and so the code lengths are from 0-7. The format of a compressed data block 215 deflated using dynamic Huffman compression is defined by RFC 1951 (incorporated by reference herein).

With reference to FIG. 10, creation of dynamic Huffman tables proceeds as follows. At block (1), codelength decoder 1010 receives the input data stream (BITSIN) from memory access controller 405 and decodes the code lengths for creating codelength Huffman table 1005. At block (2), table generator 1015 uses codelength Huffman table 1005 to decode the next portion of the input data stream (i.e., the length/literal and distance code lengths). Accordingly, at block (2) table generator 1015 decodes the length/literal code lengths and the distance code lengths and stores the values into LEN/LIT codelength memory 1020 and a distance codelength memory 1025, respectively. Since not all characters in an alphabet are always used in each dataset, many Huffman codes for encoding a particular character or symbol are not used (e.g., left unassigned) and end up being assigned a zero code length. In one embodiment, table generator 1015 will additionally generate two lists LEN/LIT nonzero values 1030 and distance nonzero values 1035 indicating which code lengths within LEN/LIT codelengths memory 1020 and distance codelengths memory 1025, respectively, are nonzero. In one embodiment, the lists merely identify the memory addresses of the nonzero values within the respective memories.

At block (3), the nonzero value lists 1030 and 1035 are referenced to read the nonzero code lengths from LEN/LIT codelengths memory 1020 and distance codelengths memory 1025. These nonzero values are then used by table generator 1015 to build dynamic LEN/LIT Huffman table 901 and dynamic Huffman table 902. Identifying the nonzero values increases the speed and efficiency of the dynamic decompressor unit 450 during block (3) by enabling table generator 1015 to skip entries within LEN/LIT codelengths memory 1020 and distance codelengths memory 1025 having an unassigned or zero value, thus reducing the number of read cycles while building tables 901 and 902.

Finally, at block (4), dynamic LEN/LIT Huffman table 901 and dynamic distance Huffman table 902 may be accessed as LUTs by length-literal decompressor 905 and distance decompressor 910 to decode the remainder of compressed data block 215 of the input data stream. Performance of block (4) is illustrated in FIG. 9.

As codelength decoder 1010 decodes each variable length code to build codelength Huffman table 1005 and table generator 1015 decodes each variable length code to build dynamic Huffman tables 901 and 902, the number of unused bits is signaled back to memory access controller 405 in the form of a decrement value so that memory pointer 436 can be updated and each decode cycle starts at the beginning of the next variable length Huffman code.

Figure 11A:
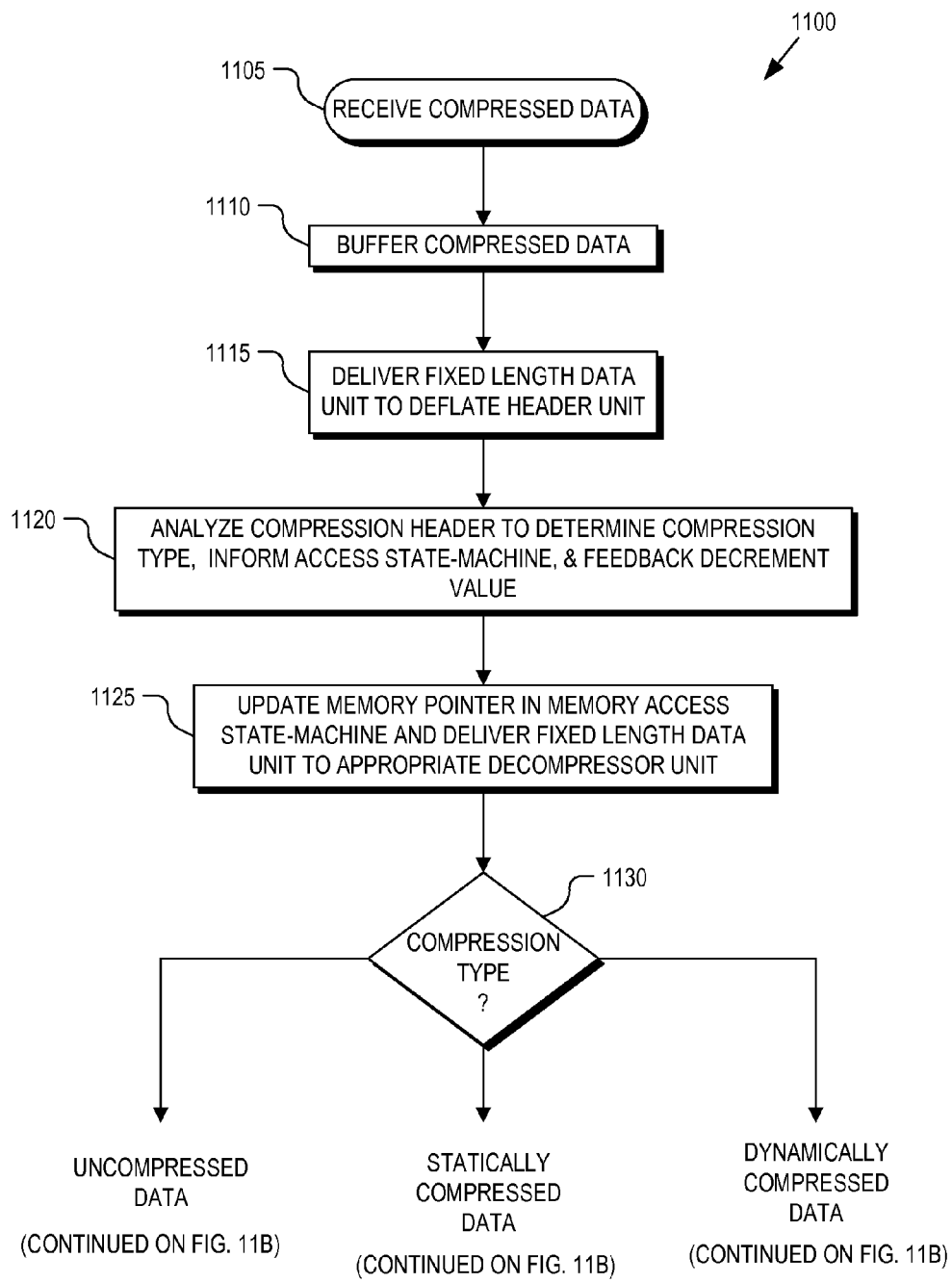
FIG. 11A is a first portion of a flow chart illustrating a process of operation of a deflate decompressor, in accordance with an embodiment of the invention.
Figure 11B:
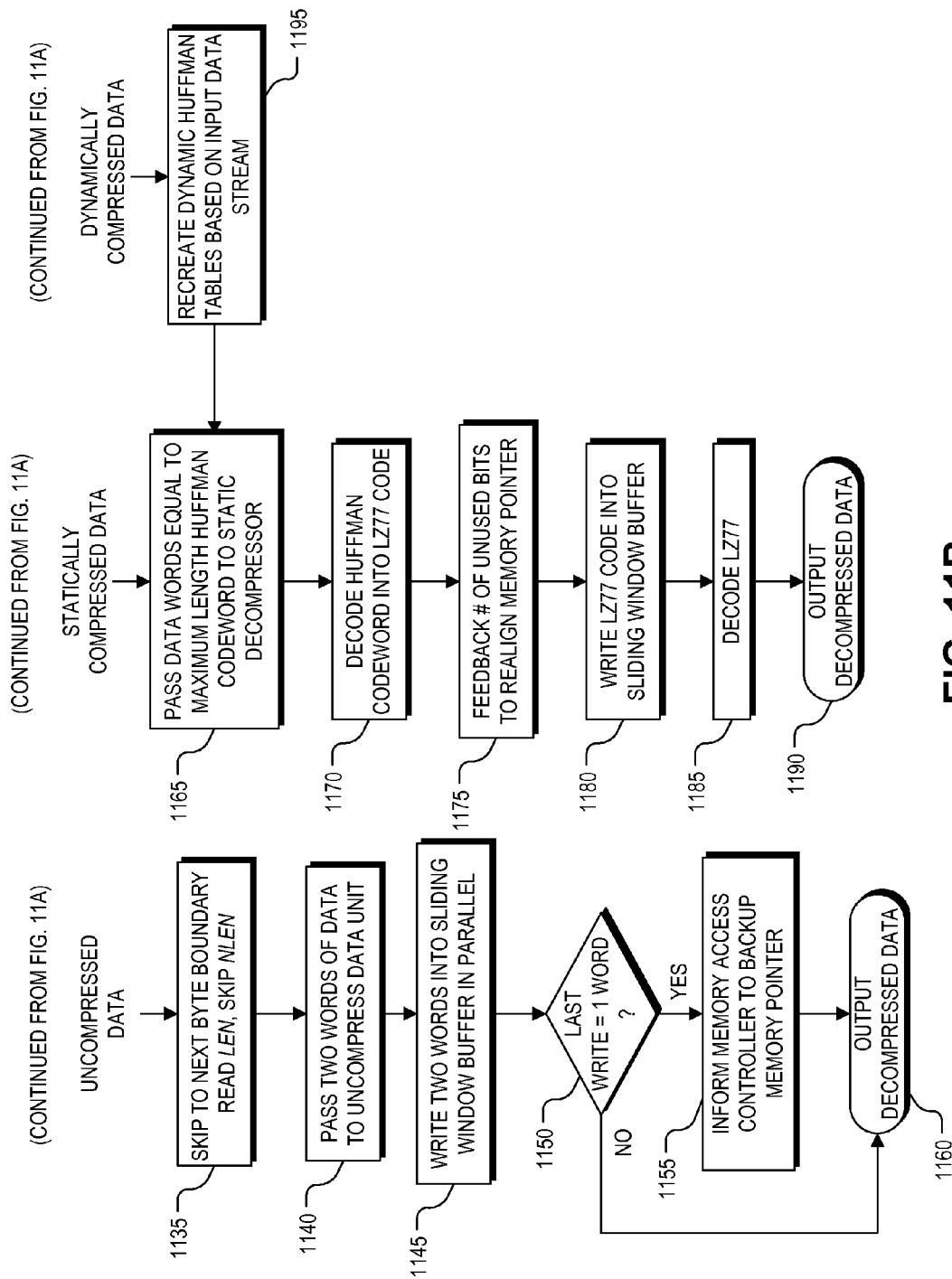
FIG. 11B is a second portion of the flow chart illustrating a process of operation of a deflate decompressor, in accordance with an embodiment of the invention.

FIGS. 11A and 11B include a flow chart illustrating a process 1100 of top-level operation of deflate decompressor 400, in accordance with an embodiment of the invention. The order in which some or all of the process blocks appear in process 1100 should not be deemed limiting. Rather, one of ordinary skill in the art having the benefit of the present disclosure will understand that some of the process blocks may be executed in a variety of orders not illustrated.

In a process block 1105, memory access controller 405 commences receiving input data stream 407. Flow control is administered using control signal 409 (e.g., ACK/NAK signaling). In the illustrated embodiment, input data stream 407 is buffered within memory access state-machine 435 using two data buffers 437 and 439 (process block 1110). Data buffer 437 is filled first, followed by data buffer 439.

In a process block 1115, data is read out of data buffer 437 and delivered to deflate header unit 410. As data is consumed from data buffer 437, this buffer is replenished with the contents of data buffer 439 and new data retrieved into data buffer 439 from input data stream 407 using control signaling 409. Data is read out of data buffer 437 starting at the buffer location referenced by memory pointer 436. Fixed length data units are delivered to deflate header unit 410 or any of decompressor units 415. In one embodiment, the fixed size of the data unit does not depend upon the particular decompression operation (e.g., decoding header, reading uncompressed data, decoding statically compressed data, decoding dynamically compressed data, etc.), and does not change due to the varying size of codes within a particular type of decompression operation. In one embodiment, the fixed size data unit is at least as large as necessary to complete any particular decompression operation being executed.

In a process block 1120, deflate header unit 410 parses the fixed sized data unit to analyze deflate header 205. Deflate header unit 410 analyzes deflate header 205 to determine the compression type (e.g., no compression, static compression, dynamic compression). Once the compression type is determined, deflate header unit 410 will feed back the number of unused bits (decrement value) to DCX MUX 430 for readjusting memory pointer 436 to the beginning of the next code word (process block 1125), inform memory access state-machine 435 of the compression type, and enable the appropriate decompressor unit. In one embodiment, the decompressor enable signals (EN) are routed to DEC MUX 430 and MUX 420 as multiplexor selector signals. In one embodiment, the decompressor enable signals are used as the mechanism for signaling to memory access state machine 435 which type of compression is to be applied and to which decompressor unit the subsequent data words should be routed.

In a process block 1125, the position of memory pointer 436 is realigned based on the received decrement value and the next fixed length data unit (e.g., data word) is delivered to the appropriate decompressor unit.

If the current compressed data block 215 of the input data stream 407 is determined by deflate header unit 410 to be an uncompressed data block (decision block 1130), then process 1100 continues to a process block 1135 (FIG. 11B). In process block 1135, memory pointer 436 is advanced to the next byte boundary, the two byte LEN value is read, and the two byte NLEN value is skipped over. In a process block 1140, two words of data are copied from data buffer 437 (sometimes extending into data buffer 439 depending upon the current position of memory pointer 436) and passed to uncompressed data unit 440. Since uncompressed data doesn't require inflation, the data is simply passed through uncompressed data unit 440 and two words are written into sliding window buffer 460 at a time using both input ports for parallel write operations under control of buffer controller 455. Uncompressed data unit 440 counts the number of words written to memory using counter 442 and compares this value with the stored LEN value to determine when the end of the block is reached. If the last write operation only includes one word of data due to the data block having an odd number of data words (decision block 1150), then single word decrement signal 441 is issued to memory access state-machine 435 by uncompressed data unit 440. Single word decrement signal 441 causes memory pointer 437 to be backed up by one word to realign memory pointer 437 at the beginning of the next code word for the next decompression cycle. Otherwise, in process block 1160, data written into sliding window buffer 460 is output on port 461.

Returning to decision block 1130, if the current compressed data block 215 of the input data stream 407 is determined by deflate header unit 410 to be a statically compressed data block, then process 1100 continues to a process block 1165 (FIG. 11B). In process block 1165, memory access state machine 435 passes a data word at least equal to the maximum length Huffman codeword to static decompressor unit 445. In process block 1170, static decompressor unit 445 decodes the Huffman code and provides the Huffman decoded data to buffer controller 445 via MUX 420. Since fixed length data words are provided to static decompressor unit 445, typically not all transferred bits will be used. In the event of unused bits, a decrement value is fed back to DEC MUX 430 to indicate how many bits to readjust memory pointer 436.

Since the deflate algorithm applies LZ77 compression followed by Huffman compression, once the Huffman compression has been decoded the remaining data string must still be LZ77 decoded to replace the length-distance pairs with pure literal strings. In a process block 1180, the LZ77 code is written into sliding window buffer 460 by buffer controller 455. In one embodiment, sliding window buffer 460 maintains a 32 kilobyte buffer of past decoded data bits. Buffer controller 455 uses the length-distance pairs to assert memory addresses on the address ports A1 and A2 along with read/write control signals to expand and decode the LZ77 code using the 32 kB sliding buffer (process block 1185). It should be appreciated that alternative length buffers may be implemented. Finally, in a process block 1190, the fully decoded data (both Huffman decoded and LZ77 decoded) is output from sliding window buffer 460 at port 461.

Returning to decision block 1130, if the current compressed data block 215 of the input data stream 407 is determined by deflate header unit 410 to be a dynamically compressed data block, then process 1100 continues to a process block 1195 (FIG. 11B). Input data stream 407 is provided by memory access state-machine 435 to dynamic decompressor unit 450. In process block 1195, the first portions of input data stream 407 are used by dynamic decompressor unit 450 to recreate the dynamic Huffman tables (e.g., codelength Huffman table 1005, dynamic LEN/LIT Huffman table 901, dynamic distance Huffman table 902) as described in connection with FIG. 10. These initial portions of input data stream 407 include the header fields: HLIT, HDIST, HCLEN, CLENC, CLENLL, and CLEND described in connection with FIG. 3. Once the Huffman tables have been recreated for the current compressed data block 215, decompression of dynamically compressed deflate data proceeds in a similar manner as the static case.

The processes explained above are described in terms of computer software and hardware. The techniques described may constitute computer-executable instructions embodied within a computer readable storage medium, that when executed by a computer will cause the computer to perform the operations described. Additionally, the processes may be embodied within hardware, such as an ASIC, FPGA, or the like.

A computer-readable storage medium includes any mechanism that provides (e.g., stores) information in a form accessible by a machine (e.g., a computer, network device, personal digital assistant, manufacturing tool, any device with a set of one or more processors, etc.). For example, a computer-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A deflate decompressor apparatus, comprising:
at least one decompressor unit for decompressing a data stream compressed according to a compression algorithm;
a memory access controller coupled to the at least one decompressor unit via a data path, the memory access controller including a data buffer to receive the data stream and temporarily buffer the data stream, wherein the memory access controller transfers fixed length data units of the data stream from the data buffer to the at least one decompressor unit with reference to a memory pointer pointing into the memory buffer;
a feedback path coupled between the at least one decompressor unit and the memory access controller, wherein the at least one decompressor unit feeds back decrement values to the memory access controller for updating the memory pointer, the decrement values each indicating a number of bits unused by the at least one decompressor unit when decoding the fixed length data units; and
an output buffer unit coupled to the at least one decompressor unit.

2. The deflate decompressor apparatus of claim 1, wherein the output buffer unit comprises:
a sliding window buffer having dual data ports and dual address ports for simultaneous reading from or writing to two locations within the sliding window buffer; and
a buffer controller coupled to receive the data stream from the at least one decompressor unit and coupled to generate address signals and control signals for reading from or writing to the sliding window buffer.

3. The deflate decompressor apparatus of claim 2, wherein the at least one decompressor unit includes an uncompressed data unit for processing uncompressed data, wherein the buffer controller is coupled to use both of the dual data ports of the sliding window buffer for writing the uncompressed data into the sliding window buffer.

4. The deflate decompressor apparatus of claim 3, wherein the uncompressed data unit includes:
- a counter for tracking a number of remaining data words of a data block to be written into the sliding window buffer; and
- logic for feeding back a single word decrement signal on the feedback path, if the counter indicates only one data word was written into the sliding window buffer.

5. The deflate decompressor apparatus of claim 1, wherein the at least one decompressor unit comprises a static decompressor unit for decompressing data compressed using static Huffman tables, the static decompressor unit comprising:
- a length-literal lookup table ("LUT") coupled to receive the fixed length data units and output length or literal values and output one of the decrement values; and
- a distance LUT coupled to receive the fixed length data units and output distance values and output one of the decrement values,
- wherein the literal values, length values, and distance values comprise Lempel-Ziv codes.

6. The deflate decompressor apparatus of claim 5, wherein the static decompressor unit further comprises:
- a plurality of distance LUTs each coupled to receive the fixed length data units and output distance values each commuted from a different offset within the fixed length data units; and
- a multiplexor unit coupled to each of the distance LUTs and having a selector input coupled to receive the decrement values output from the length-literal LUT.

7. The deflate decompressor apparatus of claim 1, wherein the at least one decompressor unit comprises a dynamic decompressor unit for decompressing data compressed using dynamic Huffman tables, the dynamic decompressor unit including:
- a length-literal decompressor coupled to receive the fixed length data units and output length or literal values and output one of the decrement values; and
- a distance decompressor coupled to receive the fixed length data units and output distance values and output one of the decrement values,
- wherein the literal values, length values, and distance values comprise Lempel-Ziv codes.

8. The deflate decompressor apparatus of claim 7, wherein the dynamic decompressor unit further comprises:
- a codelength decoder to generate a codelength Huffman table based on a first portion of the data stream; and
- a table generator coupled to access the codelength Huffman table generated by the codelength decoder and decode length-literal code lengths and decode distance code lengths based on the codelength Huffman table and a second portion of the data stream.

9. The deflate decompressor apparatus of claim 8, wherein the dynamic decompressor unit further comprises:
- a first memory for storing the length-literal code lengths;
- a second memory for storing length-literal nonzero values indicating which entries within the first memory are nonzero values;
- a third memory for storing the distance code lengths; and
- a fourth memory for storing distance nonzero values indicating which entries within the third memory are nonzero values,
- wherein the table generator is coupled to reference the second and fourth memories to reduce a number of accesses to the first and third memories when building a dynamic length-literal Huffman table and a dynamic distance Huffman table for decoding a third portion of the data stream.

10. The deflate decompressor apparatus of claim 1, wherein the at least one decompressor unit includes a static decompressor unit for decompressing data compressed using static Huffman tables and a dynamic decompressor unit for decompressing data compressed using dynamic Huffman tables, wherein the deflate decompressor apparatus further comprises:
- a deflate header unit coupled to a memory access controller to determine whether the data stream is compressed using the static Huffman tables or the dynamic Huffman tables.

11. The deflate decompressor apparatus of claim 10, wherein the memory access controller comprises:
- a memory access state-machine for controlling a location of the memory pointer; and
- a decrement multiplexor coupled to multiplex multiple feedback paths for carrying the decrement values generated by the deflate header unit, the static decompressor unit, and the dynamic decompressor unit.

12. The deflate decompressor apparatus of claim 11, further comprising a multiplexor to selectively couple outputs from the static decompressor unit and the dynamic decompressor unit to the output buffer unit under control of the deflate header unit.

13. A method for decompressing a dataset compressed using variable length codes, the method comprising:
- buffering the dataset within a data buffer;
- transferring fixed length portions of the dataset from the data buffer to a decompressor unit with reference to a memory pointer;
- decoding each of the variable length codes of the dataset based on a corresponding one of the fixed length portions;
- feeding back decrement values from the decompressor unit each indicating how many bits of one of the fixed length portions was unused by the decompressor unit to decode one of the variable length codes;
- updating a location of the memory pointer using the decrement values between transferring consecutive ones of the fixed length portions to realign the memory pointer with a start of a next variable length code; and
- outputting the dataset in an uncompressed format.

14. The method of claim 13, wherein the dataset comprises data compressed using static Huffman tables and wherein decoding each of the variable length codes of the dataset based on the corresponding one of the fixed length portions comprises:
- decoding length values and literal values from the dataset using a first lookup table;
- decoding distance values from the dataset using a plurality of second lookup tables; and
- selecting one of the plurality of second lookup tables for a given decompression cycle using an output generated from the first lookup table.

15. The method of claim 13, wherein the dataset comprises data compressed using dynamic Huffman tables, and wherein the method further comprises recreating the dynamic Huffman tables by:
- decoding length-literal code lengths from the dataset;
- decoding distance code lengths from the dataset;
- generating a first list indicating which of the length-literal code lengths are nonzero;
- generating a second list indicating which of the distance code lengths are nonzero; and referencing the first and second lists to reduce a number of memory accesses to the length-literal code lengths and the distance code lengths when recreating the dynamic Huffman tables.

16. The method of claim 13, wherein decoding each of the variable length codes of the dataset generates Lempel-Ziv coded data having literal values and length-distance pairs, the method further comprising decoding the length-distance pairs using a dual port sliding window buffer by:
reading a first data word from the dual port sliding window buffer using a first port;
writing the first data word back into the dual port sliding window buffer using a second port while reading a second data word using the first port; and
writing the second data word back into the dual port sliding window buffer using the second port while reading a third data word using the first data port.

17. The method of claim 13, wherein the dataset comprises a dataset compressed using the Deflate algorithm.

18. A computer-readable storage medium that provides instructions that, when executed by a computer, will cause the computer to perform operations for decompressing a dataset, the operations comprising:
buffering the dataset compressed using variable length codes within a data buffer;
transferring fixed length portions of the dataset from the data buffer to a decompressor unit with reference to a memory pointer;
decoding each of the variable length codes of the dataset based on a corresponding one of the fixed length portions;
feeding back decrement values from the decompressor unit each indicating how many bits of one of the fixed length portions was unused by the decompressor unit to decode one of the variable length codes;
updating a location of the memory pointer using the decrement values between transferring consecutive ones of the fixed length portions to realign the memory pointer with a start of a next variable length code; and
outputting the dataset in an uncompressed format.

19. The computer-readable storage medium of claim 18, wherein the dataset comprises data compressed using static Huffman tables and wherein decoding each of the variable length codes of the dataset based on the corresponding one of the fixed length portions comprises:
decoding length values and literal values from the dataset using a first lookup table;
decoding distance values from the dataset using a plurality of second lookup tables; and
selecting one of the plurality of second lookup tables for a given decompression cycle using an output generated from the first lookup table.

20. The computer-readable storage medium of claim 18, wherein the dataset comprises data compressed using dynamic Huffman tables, and wherein the computer-readable storage medium further provides instructions that, when executed by the computer, will cause the computer to perform further operations comprising recreating the dynamic Huffman tables by:
decoding length-literal code lengths from the dataset;
decoding distance code lengths from the dataset;
generating a first list indicating which of the length-literal code lengths are nonzero;
generating a second list indicating which of the distance code lengths are nonzero; and
referencing the first and second lists to reduce a number of memory accesses to the length-literal code lengths and the distance code lengths when recreating the dynamic Huffman tables.

21. The computer-readable storage medium of claim 18, wherein decoding each of the variable length codes of the dataset generates Lempel-Ziv coded data having literal values and length-distance pairs, and wherein the computer-readable storage medium further provides instructions that, when executed by the computer, will cause the computer to perform further operations comprising decoding the length-distance pairs using a dual port sliding window buffer by:
reading a first data word from the dual port sliding window buffer using a first port;
writing the first data word back into the dual port sliding window buffer using a second port while reading a second data word using the first port; and
writing the second data word back into the dual port sliding window buffer using the second port while reading a third data word using the first data port.

* * * * *